(12) United States Patent
Tian

(10) Patent No.: US 10,431,602 B2
(45) Date of Patent: Oct. 1, 2019

(54) ARRAY SUBSTRATE, DISPLAY PANEL, AND DISPLAY APPARATUS

(71) Applicants: BOE TECHNOLOGY GROUP CO., LTD., Beijing (CN); BEIJING BOE OPTOELECTRONICS TECHNOLOGY CO., LTD., Beijing (CN)

(72) Inventor: Lu Tian, Beijing (CN)

(73) Assignees: BOE TECHNOLOGY GROUP CO., LTD., Beijing (CN); BEIJING BOE OPTOELECTRONICS TECHNOLOGY CO., LTD., Beijing (CN)

( * ) Notice: Subject to any disclaimer, the term of this patent is extended or adjusted under 35 U.S.C. 154(b) by 0 days.

(21) Appl. No.: 15/572,090

(22) PCT Filed: Jun. 7, 2017

(86) PCT No.: PCT/CN2017/087371
§ 371 (c)(1),
(2) Date: Nov. 6, 2017

(87) PCT Pub. No.: WO2017/211281
PCT Pub. Date: Dec. 14, 2017

(65) Prior Publication Data
US 2018/0350840 A1 Dec. 6, 2018

(30) Foreign Application Priority Data
Jun. 8, 2016 (CN) .......................... 2016 1 0405600

(51) Int. Cl.
*H01L 27/14* (2006.01)
*H01L 27/12* (2006.01)
(Continued)

(52) U.S. Cl.
CPC .......... *H01L 27/124* (2013.01); *G02F 1/1339* (2013.01); *G02F 1/1345* (2013.01);
(Continued)

(58) Field of Classification Search
CPC ..................................................... H01L 27/124
(Continued)

(56) References Cited

U.S. PATENT DOCUMENTS 4,634,631 A * 1/1987 Gazit ..................... B32B 15/08
428/421
7,889,306 B1 2/2011 Ko et al.
(Continued)

FOREIGN PATENT DOCUMENTS

CN 101842742 A 9/2010

OTHER PUBLICATIONS

International Search Report and Written Opinion in PCT/CN2017/087371 dated Aug. 31, 2017.
(Continued)

*Primary Examiner* — Ajay Arora
(74) *Attorney, Agent, or Firm* — Syncoda LLC; Feng Ma

(57) ABSTRACT

An array substrate is disclosed herein, which includes a display area and a surrounding area. The surrounding area encircles the display area, and includes a first zone and a second zone. The first zone and the second zone are configured to have a height difference to form a substantially uneven upper surface of the array substrate to thereby allow a sealant to be securely attached onto the array substrate. The array substrate further includes a substrate, a first signal line, and a second signal line. The first signal line is disposed over the substrate. The second signal line is disposed over, insulated from, and staggered at a staggering region with, the first signal line. It is configures such that the staggering
(Continued)

region is in the first zone. A display panel and a display apparatus containing the array substrate is further disclosed.

19 Claims, 8 Drawing Sheets

(51) Int. Cl.
  *G02F 1/1339* (2006.01)
  *G02F 1/1345* (2006.01)
  *G02F 1/1362* (2006.01)
  *G02F 1/1333* (2006.01)
  *G02F 1/1368* (2006.01)
  *H01L 23/31* (2006.01)
(52) U.S. Cl.
  CPC ...... *G02F 1/1368* (2013.01); *G02F 1/133345* (2013.01); *G02F 1/136286* (2013.01); *H01L 23/3135* (2013.01); *H01L 27/1218* (2013.01); *H01L 27/1259* (2013.01); *G02F 2001/133388* (2013.01); *G02F 2202/28* (2013.01)
(58) Field of Classification Search
  USPC ........................................................... 257/72
  See application file for complete search history.

(56) References Cited

U.S. PATENT DOCUMENTS

| | | | |
|---|---|---|---|
| 8,031,318 | B2 | 10/2011 | Aoki |
| 9,740,052 | B2* | 8/2017 | Taniguchi ............. G02F 1/1339 |
| 2006/0139505 | A1 | 6/2006 | Yoshinaga |
| 2007/0030409 | A1 | 2/2007 | Aoki |
| 2009/0242888 | A1* | 10/2009 | Hosoya ............. G02F 1/136213 257/59 |
| 2015/0029428 | A1 | 1/2015 | Wang |
| 2015/0173232 | A1 | 6/2015 | Chai |
| 2015/0243705 | A1* | 8/2015 | Kim ................... H01L 27/3258 257/88 |
| 2017/0010510 | A1* | 1/2017 | Hao .................. G02F 1/136286 |

OTHER PUBLICATIONS

1st Office Action in CN201610405600.5 dated May 2, 2018.
Extended European search report in EP 17809720.0 dated Dec. 13, 2018.
2nd Office Action in CN201610405600.5 dated Mar. 25, 2019.

* cited by examiner

ARRAY SUBSTRATE, DISPLAY PANEL, AND DISPLAY APPARATUS

CROSS-REFERENCE TO RELATED APPLICATION

The present application claims priority to Chinese Patent Application No. 201610405600.5 filed on Jun. 8, 2016, the disclosure of which is hereby incorporated by reference in its entirety.

TECHNICAL FIELD

The present disclosure is related generally to display technologies, and more specifically to an array substrate, a display panel, and a display apparatus.

BACKGROUND

Because of their small sizes, low energy consumption, absence of irradiation, and low manufacturing cost, thin film transistor liquid crystal displays (TFT-LCD) have been widely applied in the field of high-performance display.

Resin, due to its relatively low dielectric constant, has been more and more employed as the composition of insulating layers to replace SiNx, a traditional material for use as the composition of insulating layers. It is advantageous in reducing energy consumption, increasing flatness, and increasing the aperture ratio, etc., for the thin film transistor liquid crystal displays. However, the use of resin in the insulating layers also brings about issues in the manufacturing process and/or during actual usage.

For example, the presence of a resin layer in a surrounding region of a display panel can cause a sealant to easily fall off from the display panel.

SUMMARY

In order to address the above-mentioned issues associated with the use of resin, the present disclosure provides an array substrate, a display panel, and a display apparatus.

In a first aspect, an array substrate is disclosed herein. The array substrate includes a display area and a surrounding area, wherein the surrounding area encircles the display area.

The surrounding area includes a first zone and a second zone. The first zone and the second zone are configured to have a height difference to form a substantially uneven upper surface of the array substrate to thereby allow a sealant to be securely attached onto the array substrate.

The array substrate further includes a substrate, a first signal line, and a second signal line. The first signal line is disposed over the substrate, and the second signal line is disposed over the first signal line. The second signal line is insulated from, and staggered at a staggering region with, the first signal line.

Herein the staggering region is in the first zone, and an orthographic projection of the first signal line on the substrate crosses an orthographic projection of the second signal line on the substrate at a region coinciding with an orthographic projection of the staggering region on the substrate.

The array substrate further includes an insulating layer, which is disposed between the first signal line and the second signal line at the staggering region, and is configured to provide an insulation between first signal line and the second signal line.

The array substrate can further comprise a separation layer, which is disposed between the insulating layer and the second signal line at the staggering region.

The array substrate can further include at least one thin-film transistor (TFT), each having a gate electrode, a gate insulating layer, a semiconductor active layer, a source electrode, and a drain electrode, successively disposed over the substrate.

In the array substrate as described above, the first signal line and the gate electrode are configured to be at a substantially same layer and have a substantially same composition; the insulating layer and the gate insulating layer are configured to be at a substantially same layer and have a substantially same composition; the separation layer and the semiconductor active layer are configured to be at a substantially same layer and have a substantially same composition; and the second signal line and the source electrode and the drain electrode are configured to be at a substantially same layer and have a substantially same composition.

According to some embodiments, the array substrate further includes at least one insulating material layer, which is disposed over an upper surface of the first zone and the second zone of the surrounding area. It is configured such that the at least one insulating material layer has a thickness in the first zone lower than in the second zone.

According to some embodiments, the array substrate further includes at least one insulating material layer, which is disposed over an upper surface of the second zone of the surrounding area.

In the above mentioned array substrate having the first signal line and the second signal line staggered at the staggered region, the array can further include at least one insulating material layer, which is disposed over an upper surface of the staggering region in the first zone and the second zone. The at least one insulating material layer is configured to have a thickness in the staggering region lower than in the second zone.

Herein the at least one insulating material layer can include a resin layer. The resin layer can have a dielectric constant of substantially 1 to 4.

In the aforementioned array substrate, in addition to the resin layer, the at least one insulating material layer can further include a protection layer.

Herein, the protection layer can be disposed over the resin layer, and the protection layer can comprise $SiN_x$.

According to some embodiments of the array substrate, an upper surface of the first zone of the surrounding area is substantially flat.

According to some embodiments of the array substrate, an upper surface of the second zone of the surrounding area is uneven.

In a second aspect, the present disclosure further provides a display panel. The display panel includes an array substrate according to any of the embodiments as described above.

The display panel can further include an opposite substrate and a sealant. The sealant is disposed between the array substrate and the opposite substrate, and the sealant is configured to securely attach the array substrate in the first zone and the second zone in the surrounding area of the array substrate.

In a third aspect, the present disclosure further provides a display apparatus. The display apparatus includes a display panel according to any of the embodiments as described above.

Other embodiments may become apparent in view of the following descriptions and the attached drawings.

BRIEF DESCRIPTION OF THE DRAWINGS

To more clearly illustrate some of the embodiments, the following is a brief description of the drawings. The drawings in the following descriptions are only illustrative of some embodiment. For those of ordinary skill in the art, other drawings of other embodiments can become apparent based on these drawings.

DETAILED DESCRIPTION

In the following, with reference to the drawings of various embodiments disclosed herein, the technical solutions of the embodiments of the disclosure will be described in a clear and fully understandable way.

It is obvious that the described embodiments are merely a portion but not all of the embodiments of the disclosure. Based on the described embodiments of the disclosure, those ordinarily skilled in the art can obtain other embodiment(s), which come(s) within the scope sought for protection by the disclosure.

In a first aspect, the present disclosure provides an array substrate.

The array substrate comprises a display area and a surrounding area. The surrounding area encircles the display area, and the surrounding area includes a first zone and a second zone, wherein the first zone and the second zone are configured to have a height difference to form a substantially uneven upper surface of the array substrate to thereby allow a sealant to be securely attached onto the array substrate.

Herein the height difference of the first zone and the second zone is referred to a difference between the height of the first zone and the height of the second zone, and is more specifically referred to as the thickness difference of the film layers in the first zone and in the second zone.

The array substrate can further include a substrate, a first signal line which is disposed over the substrate, and a second signal line which is disposed over and insulated from the first signal line, and is further staggered with the first signal line at a staggering region.

Herein the staggering region is in the first zone, and it is defined as the following: an orthographic projection of the first signal line on the substrate crosses an orthographic projection of the second signal line on the substrate at a region coinciding with an orthographic projection of the staggering region on the substrate.

The array substrate can be from a TFT-LCD, which is typically provided, at a surrounding area, with a drive circuit and signal lines configured to provide signals to the drive circuit.

Figure 1:
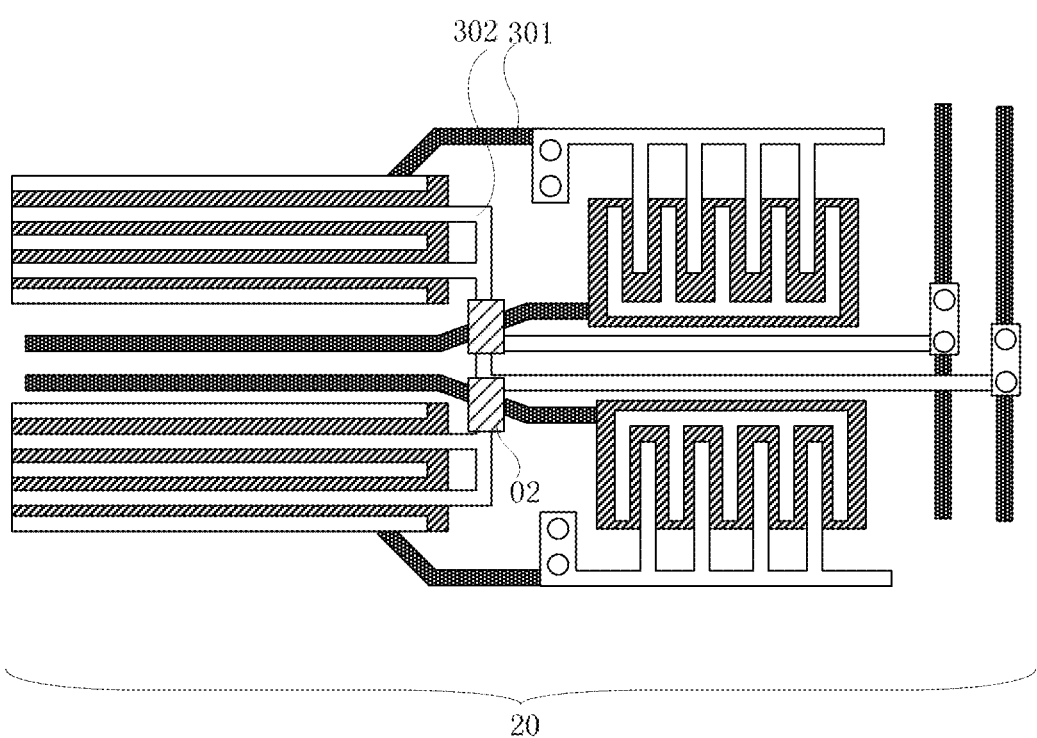
FIG. 1 is a schematic diagram illustrating a surrounding area of an array substrate.

In an array substrate as shown in FIG. 1, signal lines comprise a plurality of first signal lines 301 and a plurality of second signal lines 302. A staggering region between one first signal line 301 and second signal lines 302 is provided with an insulating island 02, which usually covers the uppermost second signal line 302. The insulating island 02 is configured to insulate an electrical connection between the first signal line 301 and the second signal lines 302 in a subsequent patterning process, such as an etching process, during manufacturing of other thin film layers. However, the presence of the insulating island 02 can adversely affects the spin-coating process of a photoresist, in turn causing an uneven coating of the photoresist.

Figure 2:
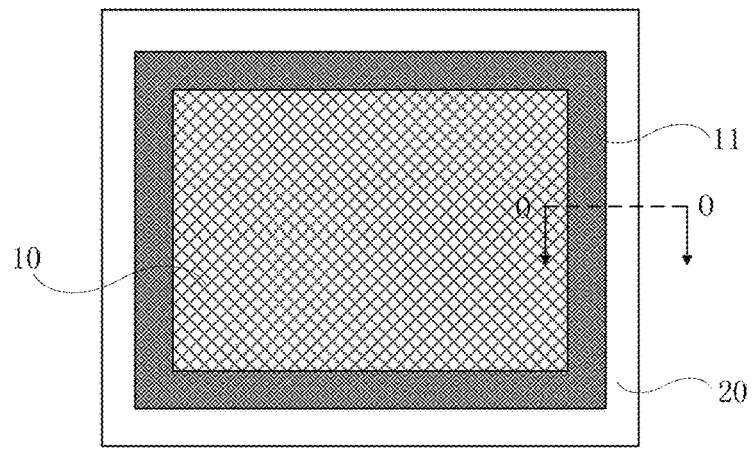
FIG. 2 is a schematic diagram of an array substrate having a display area and a surrounding area according to some embodiments of the present disclosure.

FIG. 2 illustrates an array substrate according to some embodiments of the present disclosure. As shown in FIG. 2, the array substrate comprises a display area 10, and a surrounding area 20 that surrounds that display area 10.

Figure 3:
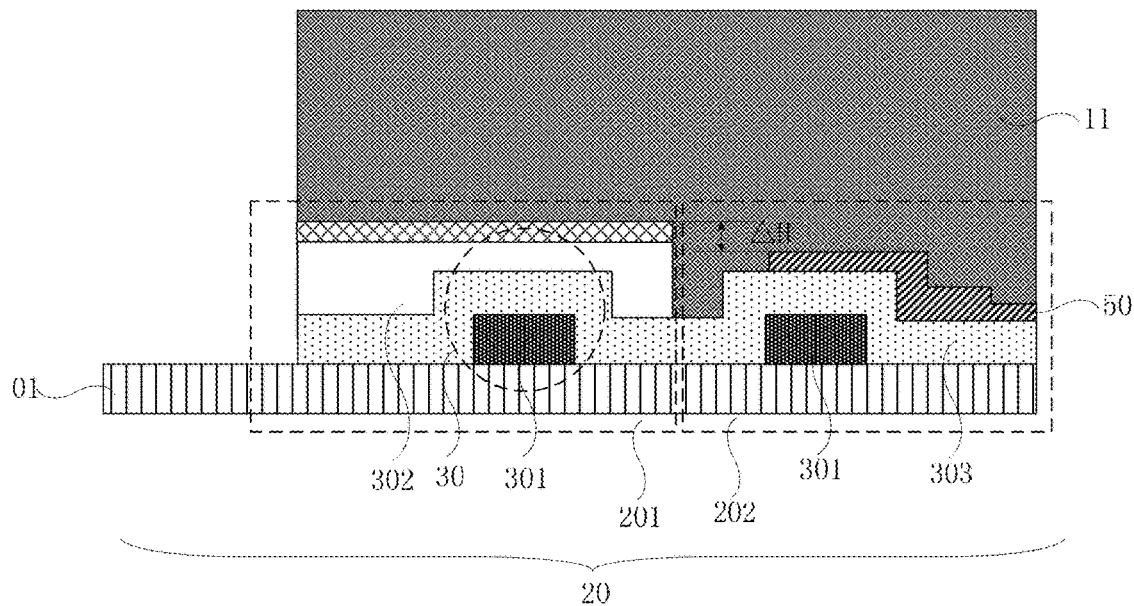
FIG. 3 is a cross-sectional view of an array substrate as shown in FIG. 2 along a direction of O-O, according to some first embodiments of the present disclosure.

As shown in FIG. 3, the surrounding area 20 is provided, or arranged, with a first signal line 301 and a second signal line 302, which have a staggering region 30 and are configured to be insulated from each other. Additionally, a first zone 201 is arranged in the surrounding area 20, and the staggering region 30 between the first signal line 301 and the second signal line 302 is configured to localize within the first zone 201.

As shown in FIG. 3, an insulating layer 303 can be arranged between the first signal line 301 and the second signal line 302 at the staggering region 30. The insulating layer 303 is configured to insulate an electrical connection between the first signal line 301 and the second signal line 302.

It should be noted that typically there are a plurality of thin-film layers that are stacked one another over the substrate 01 of the array substrate. As such, the staggering region 30 between the first signal line 301 and the second signal line 302 is referred to as the region where part of the first signal line 301 and part of the second signal line 302 are staggered (i.e. the orthographic projection of the first signal line 301 on the substrate 01 and the orthographic projection of the second signal line 302 on the substrate 01 overlaps at the orthographic projection of the staggering region 30 on the substrate 01).

The first zone 201 is referred to as a zone in the surrounding area 20 wherein the substrate having the first signal line 301 and the second signal line 302 has a substantially flat upper surface.

As such, when spin-coating a photoresist during fabrication of other thin-film layers over the substrate having the first signal line 301 and the second signal line 302, the photoresist can be evenly coated or distributed in the first zone 201, and consequently, a layer of the photoresist having an approximately equal thickness can thus be formed in the first zone 201.

Herein there is no limitation to the position of the first signal line 301 and the second signal line 302 relative to the substrate 01. For convenience in description, the second signal line 302 is exemplified to be over, or above, the first signal line 301 in the following disclosure, i.e., the first signal line 301 is first formed over the substrate 01, followed by forming the second signal line 302.

Herein the directional terms regarding the relative positions, such as "over", "above", "below", "upper", and "lower", are defined against the cross-sectional view of the array substrate as illustrated in FIG. 3. It should be understood that these directional terms are relative concepts for the description and clarification of the relative positions, which can vary in accordance with the altered orientation of the cross-sections of the array substrate. There are no limitations herein.

According to the embodiments of the present disclosure as described above, the array substrate comprises a surrounding area. The surrounding area is provided or arranged with a first signal line and a second signal line, which have a staggering region and are configured to be insulated from each other. A first zone is arranged in the surrounding area, and the staggering region between the first signal line and the second signal line is configured to localize within the first zone.

As such, even if a thin-film layer that is subsequently disposed in the staggering region between the first signal line and the second signal line has a relatively big thickness, because the staggering region is within the first zone and the substrate having the first signal line and the second signal line has a flat upper surface in the first zone, when spin-coating a photoresist during fabrication of other thin-film layers, the photoresist can be evenly spread or distributed in the first zone to thereby form an evenly coated layer of photoresist in the first zone. Consequently, the issue that incomplete etching occurs at some portions of the thin film layer that are covered by a relatively thick layer of the photoresist can be effectively avoided.

The array substrate as illustrated in FIG. 2 further comprises a sealant 11, disposed in the surround area 20. As shown in FIG. 3, a second zone 202 can be arranged in the surrounding area 20, which is next to the first zone 201. A first part of the sealant 11 can be disposed in the first zone 201, and the rest (i.e. a second part) of the sealant 11 can be disposed in the second zone 202.

The second zone 202 can be disposed to be on one side, or on both two sides, of the first zone 201. There are no limitations to the number and position of the first zone 201 and the second zone 202.

As shown in FIG. 3, a height difference ΔH is configured between a first thin-film layer in the first zone 201 that attaches the sealant 11 and a second thin-film layer in the second zone 202 that attaches the sealant 11. The configuration of the height difference ΔH between the first and the second thin-film layers causes the sealant 11 that attaches the array substrate to have an uneven surface, which results in an increased affinity between the sealant 11 and the array substrate, ultimately leading to a lowered chance for detachment of the sealant 11 from the array substrate.

Additionally, in order to further increase the extent of unevenness of the surface of the sealant 11 that attaches the array substrate, an uneven structure 50 which is configured to attach the sealant 11 (i.e. an existing layer or an additional layer with an uneven surface attaching the sealant 11) can be further arranged in the second zone 202, as illustrated in FIG. 3.

The uneven structure 50 can be formed on a thin-film layer that is additionally fabricated over the array substrate before assembly of the sealant 11 (i.e. a layer that is independent from existing layers), wherein an attachment surface between the thin-film layer and the sealant 11 is configured to be uneven. Yet such a configuration can cause an increased thickness of the array substrate, which is disadvantageous to the design for ultra-thin display apparatuses.

As such, preferably the uneven structure 50 can be formed on an existing thin-film layer during fabrication of the array substrate. There are no limitations herein.

It should be noted that a first thin-film layer in the first zone 201 that attaches the sealant 11 and a second thin-film layer in the second zone 202 that attaches the sealant 11 can have a different material.

Alternatively, the first thin-film layer in the first zone 201 that attaches the sealant 11 and the second thin-film layer in the second zone 202 that attaches the sealant 11 can have a same material.

For example, a thin-film layer comprising an insulating composition (i.e. an insulating material layer) can be formed on the substrate having the second signal line 302. As such, the thin-film layer can comprise $SiN_x$.

However, due to the poor light transmission rate for $SiN_x$, the thin-film layer having a composition of $SiN_x$ is disadvantageous to increasing the aperture ratio of the display panel. For the above reason, in order to increase the aperture ratio of the display panel, a composition of resin can be used to replace the composition of $SiN_x$ when forming the thin-film layer comprising an insulating composition.

On the above basis, in order to avoid the formation of a capacitor with relatively large capacitance to thereby reduce the energy consumption of the array substrate, preferably the insulting composition can have a dielectric constant of 1 to 4.

Figure 4:
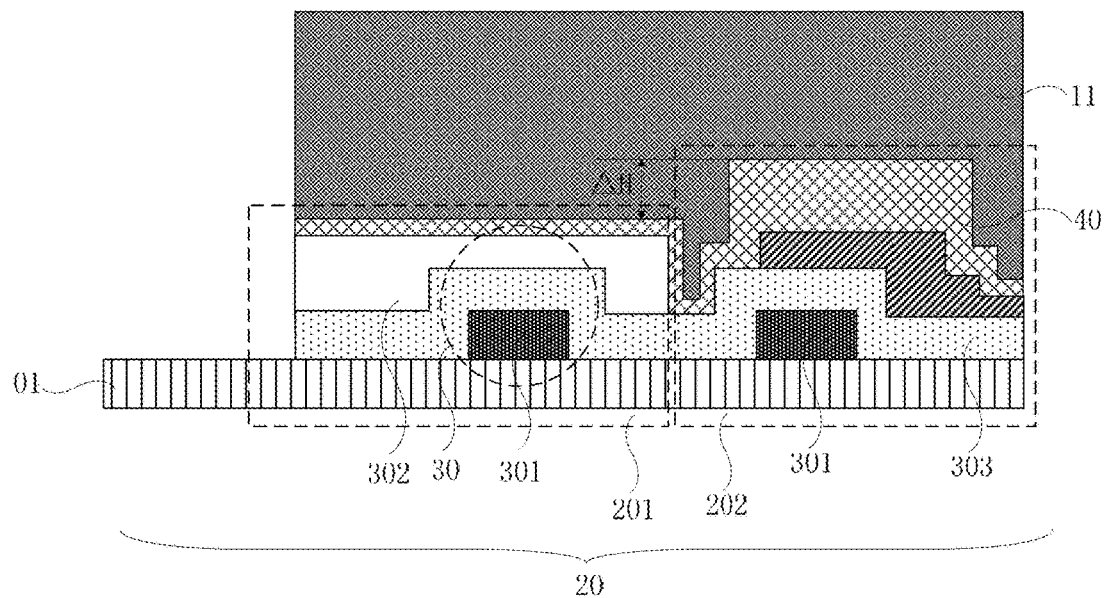
FIG. 4 is a cross-sectional view of an array substrate as shown in FIG. 2 along a direction of O-O, according to some second embodiments of the present disclosure.
Figure 5:
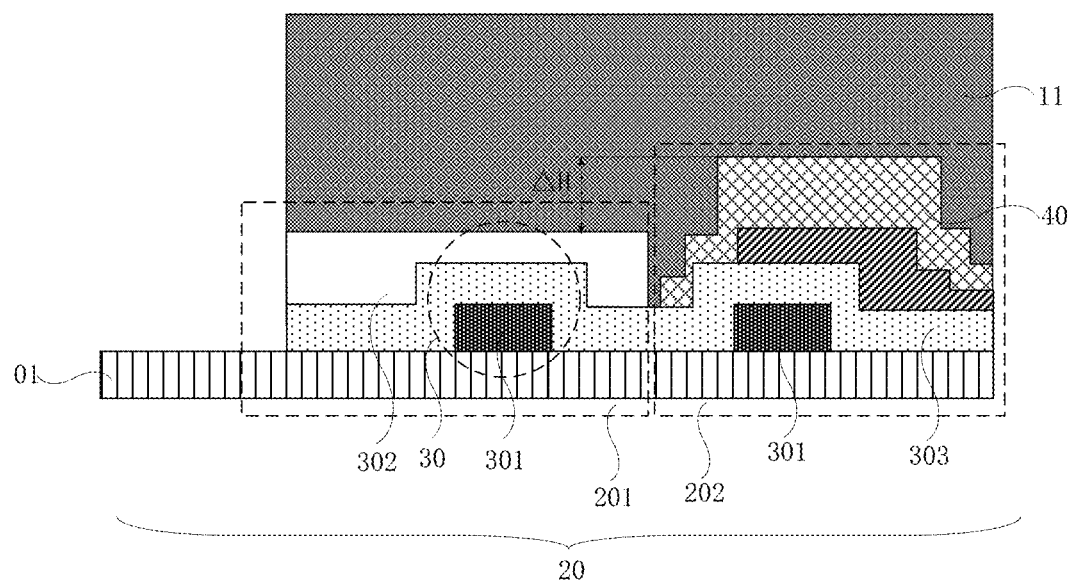
FIG. 5 is a cross-sectional view of an array substrate as shown in FIG. 2 along a direction of O-O, according to some third embodiments of the present disclosure.

The following is a detailed description of an array substrate whose uneven structure 50 comprises a composition of resin, i.e., which has a resin layer 40 in the surrounding area 20 corresponding to the sealant 11, as exemplified in FIG. 4 or FIG. 5.

As shown in FIG. 4, in the array substrate having the second signal line 302 above the first signal line 301, a resin layer 40 is disposed between the sealant 11 and the second signal line 302. A first portion of the resin layer 40 in the first zone 201 and a second portion of the resin layer 40 in the second zone 202 are configured to have different thickness, i.e. to have a height difference ΔH.

As such, by arranging a resin layer 40 in the first zone 201, the height difference between the staggering region 30 that is between the first signal line 301 and the second signal line 302 and other regions in the first zone 201 can be reduced, thereby causing the substrate having the first signal line 301 and the second signal line 302 has a close-to-be flat upper surface in the first zone 201.

On the other hand, by configuring a height difference ΔH between the first portion of the resin layer 40 in the first zone 201 and the second portion of the resin layer 40 in the second zone 202, the sealant 11 and the array substrate can have an uneven attaching surface (or interface), resulting in an increased attachment, or an increased affinity, between the sealant 11 and the array substrate.

Figure 6:
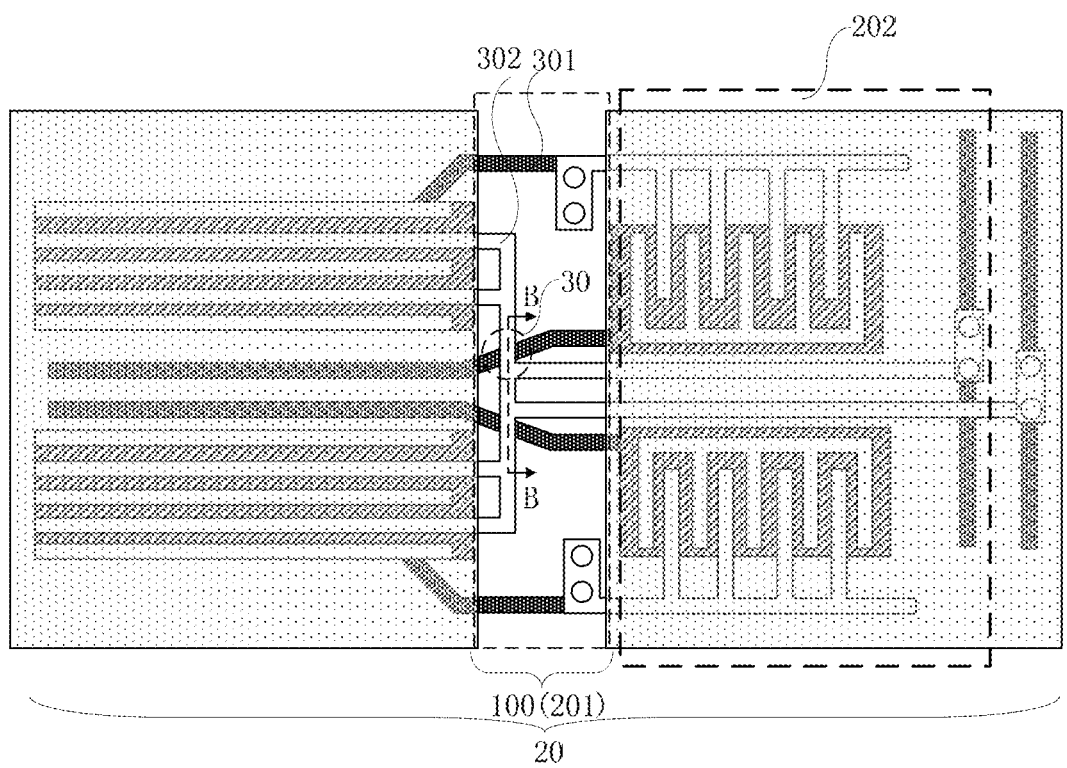
FIG. 6 is a top view of the array substrate as shown in FIG. 5, according to some embodiments of the present disclosure.

If the first portion of the resin layer at a region corresponding to the first zone 201 (as shown in FIG. 5) is removed, an empty region 100 can be formed on the resin layer 40, as illustrated in FIG. 6, and the first zone 201 positionally corresponds to the empty region 100 in the resin layer 40. In the array substrate as such, there is still a height difference ΔH between the second signal line 302 that attaches the sealant 11 in the first zone 201 and the second portion of the resin layer 40 attaching the sealant 11 in the second zone 202.

A such, by removing the first portion of the resin layer at a region corresponding to the first zone 201 to thereby form the empty region 100, the substrate having the first signal line 301 and the second signal line 302 can thus have a close-to-be flat upper surface in the first zone 201.

On the other hand, by configuring the empty region 100, a height difference ΔH of the resin layer 40 can be arranged between the first zone 201 and the second zone 202, the sealant 11 and the array substrate can thus have an uneven attaching surface (or interface), resulting in an increased attachment, or an increased affinity, between the sealant 11 and the array substrate.

It should be noted that an insulating layer 303 can be disposed between the first signal line 301 and the second signal line 302 at a region corresponding to the staggering region 30 between the first signal line 301 and the second signal line 302 to thereby insulate the first signal line 301 and the second signal line 302, because of the coverage of the second signal line 302 on the insulating layer 303 at the staggering region 30, the insulating layer 303 can survive the subsequent fabrication processes, which include the etching process, resulting in the maintenance of the insulation between the first signal line 301 and the second signal line 302.

In addition to the first signal line 301 and the second signal line 302, the surrounding area 20 can also include a gate drive circuit, such as a gate driver on array (GOA). The gate drive circuit is configured to perform a line-by-line scanning of the gate lines in the display area 10.

Figure 9:
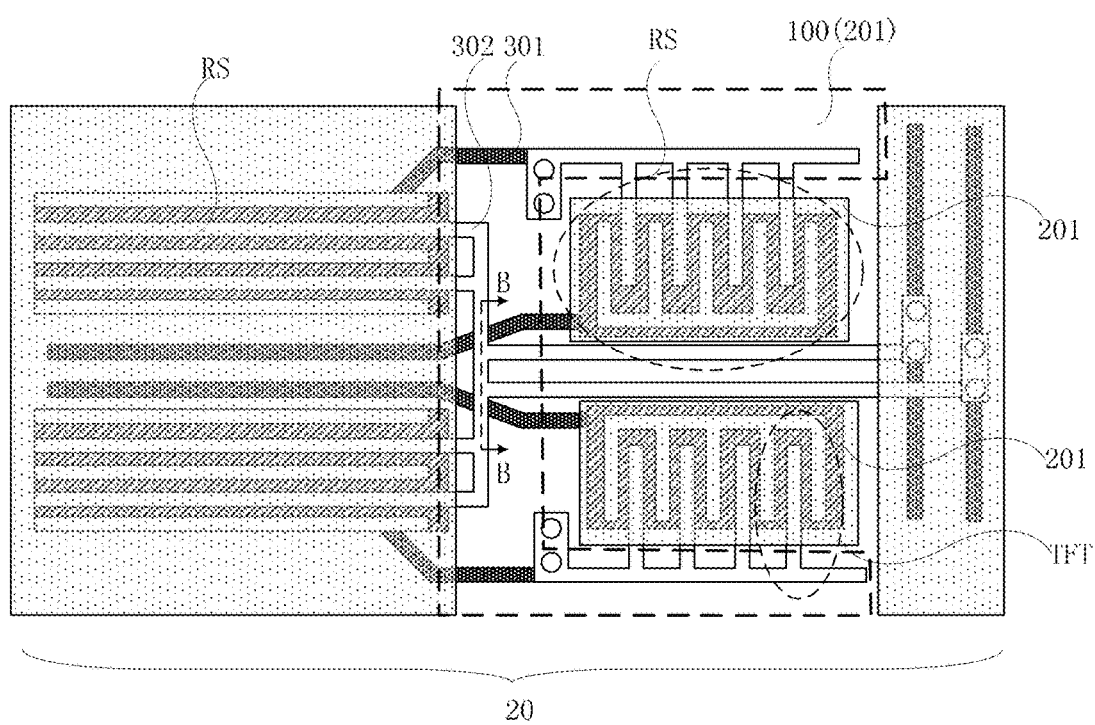
FIG. 9 is a top view of the array substrate as shown in FIG. 5, according to some other embodiments of the present disclosure.

On the above basis, if the sealant 11 has a relatively big width, a plurality of cascaded shift registers (RS), configured to together form the gate drive circuit as described above, can be disposed in the region 100 corresponding to the sealant 11 in the surrounding area 20, as shown in FIG. 9.

As such, the thin-film transistors (TFTs) in the plurality of the shift registers (RS) as described above are in the second zone 202. Because the second portion of the resin layer 40 in the second zone 202 is not removed, the second portion of the resin layer 40 can thus protect a semiconductor active layer of the TFTs in the plurality of the shift registers (RS). Thereby, the issue that the etching process may damage the semiconductor active layer of the TFTs during the patterning and fabrication of other thin-film layers over the resin layer 40 can be effectively avoided.

It is noted that each cascade of the shift registers (RS) in the gate drive circuit is electrically connected with one gate line in the display area, and as such, the gate drive circuit can shift the gate drive signal through the shift register (RS), thereby allowing a line-by-line scanning of the gate lines.

Figure 7:
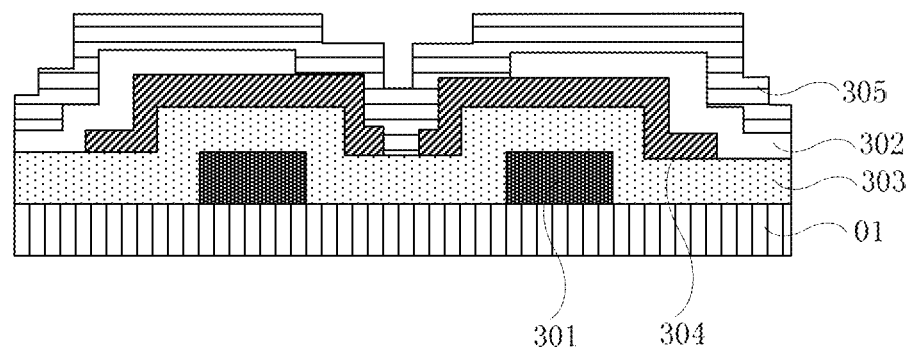
FIG. 7 is a cross-sectional view of the array substrate as shown in FIG. 5, along a direction of B-B.

Although an insulating layer 303 as described above has been arranged between the first signal line 301 and the second signal line 302 to provide insulation between the first signal line 301 and the second signal line 302, in order to further increase the level of protection to prevent an electrostatic breakdown from happening between the first signal line 301 and the second signal line 302, a separation layer 304 can be additionally disposed between the insulation layer 303 and the second signal line 302, as illustrated in FIG. 7.

Furthermore, if the array substrate contains TFTs (for example, a pixel subunit in the display area 10 comprises a TFT, or the shift register (RS) in the surrounding area 20 comprises a TFT), the first signal line 301, the second signal line 302, the insulating layer 303, and the separation layer 304 as described above can be fabricated during the manufacturing of the TFTs, so as to simplify the fabrication processes of the array substrate.

Figure 8:
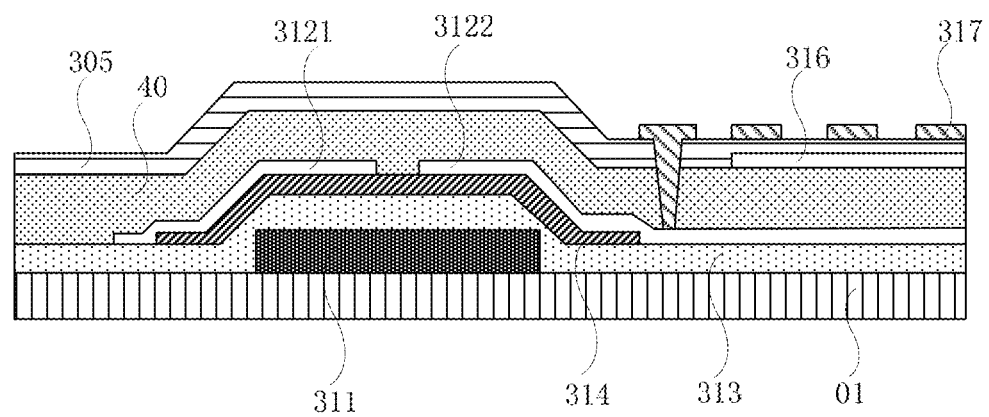
FIG. 8 is a schematic diagram of an array substrate having a TFT according to some embodiments of the present disclosure.

Specifically, during manufacturing of the gate electrode 311 of the TFT as shown in FIG. 8, the first signal line 301 as shown in FIG. 7, which is at a same layer and has a same composition as the gate electrode 311, can be manufactured at the same time when the gate electrode 311 is manufactured.

When forming a gate insulating layer 313 over the gate electrode 311, the insulating layer 303 at a same layer and having a same composition as the gate insulating layer 313 can be fabricated at a same time when the gate insulating layer 313 is fabricated.

When forming a semiconductor active layer 314 over the gate insulating layer 313, the separation layer 304 at a same layer and having a same composition as the semiconductor active layer 314 can be fabricated at a same time when the semiconductor active layer 314 is fabricated.

When forming a source electrode 3121 and a drain electrode 3122 over the semiconductor active layer 314, the second signal line 302 at a same layer and having a same composition as the source electrode 3121 and the drain electrode 3122 can be fabricated at a same time when the source electrode 3121 and the drain electrode 3122 are fabricated.

If the resin layer 40 comprises an empty region 100 positionally corresponding to the first zone 201, as illustrated in FIG. 6 or FIG. 8, because of the absence of the resin layer 40 over the second signal line 302 or the first signal line 301 in the empty region 100, oxidation can easily occur on the surface of the second signal line 302 and the first signal line 301.

To prevent oxidation of the signal lines, a protection layer 305 can be disposed between the sealant 11 and the resin layer 40, as illustrated in FIG. 7 and FIG. 8. The protection layer 305 covers the resin layer 40 and is configured to cover the first signal line 301 or the second signal line 302 to thereby protect the surface of the first signal line 301 or the second signal line 302 from oxidation. The protection layer 305 can have a composition of $SiN_x$.

In another aspect, the present disclosure provides a display apparatus, which comprises an array substrate according to any of the embodiments as described above, and thus also has a same structure and beneficial effects as the array substrate as described above.

Herein the display apparatus can be a liquid crystal display device, which can be a liquid crystal monitor, a liquid crystal TV set, a digital camera, a cell phone, a tablet, or any device that has a part of display function.

Figure 10:
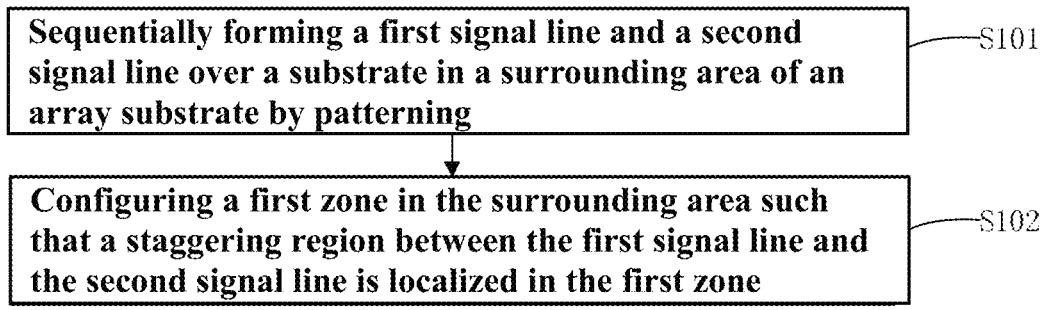
FIG. 10 is a flow chart of a method for manufacturing an array substrate according to some embodiments of the present disclosure.

In yet another aspect, the present disclosure provides a method for manufacturing an array substrate according to any of the embodiments as described above. As shown in FIG. 10, the method can comprise the following steps.

S101: sequentially forming a first signal line 301 and a second signal line 302 over a substrate 01 (as shown in FIG. 3) in a surrounding area 20 (as shown in FIG. 2) of an array substrate by a patterning process.

Herein the first signal line 301 and the second signal line 302 are configured to be insulated from each other and have a staggering region 30.

Specifically, an insulating layer 303 (as shown in FIG. 7) can be formed between the first signal line 301 and the second signal line 302 at a region corresponding to the staggering region 30 between the first signal line 301 and the second signal line 302, so as to realize the insulation between the first signal line 301 and the second signal line 302.

S102: configuring a first zone 201 in the surrounding area 20 such that the staggering region 30 between the first signal line 301 and the second signal line 302 is localized in the first zone 201.

As such, even if a thin-film layer that is subsequently disposed in the staggering region between the first signal line and the second signal line has a relatively big thickness, because the staggering region is within the first zone and the substrate having the first signal line and the second signal line has a flat upper surface in the first zone, when spin-coating a photoresist during fabrication of other thin-film layers, the photoresist can be evenly spread in the first zone to thereby form an evenly coated layer of photoresist in the first zone. Consequently, the issue that incomplete etching occurs at part of the thin film layer that is covered by a relatively thick layer of the photoresist can be effectively avoided.

It should be noted that the patterning process can include a lithographic process, or a lithographic process and an etching process, and can also include ink-printing or other processes for forming a predetermined pattern. Herein the lithographic process is a patterning process comprises film forming, exposing, developing, and etching, etc., that typically involves the use of photoresists, masks, exposure machines. The specific patterning process can be selected based on the specific compositions and structures in the array substrate in the present disclosure.

The one-time patterning process is referred to as a process whereby various exposing regions are first formed by one-time exposure process, followed by a plurality of removing processes such as etching and ashing on each different exposing region to ultimately form a predetermined pattern.

As shown in FIG. 3, a height difference ΔH can be configured between a first thin-film layer in the first zone 201 that attaches the sealant 11 and a second thin-film layer in the second zone 202 that attaches the sealant 11. The configuration of the height difference ΔH between the first thin-film layer and the second thin-film layer can cause a surface of the array substrate that attaches to the sealant 11 to be uneven, resulting in an increased attachment or affinity between the sealant 11 and the array substrate, and leading to a lowered chance for detachment of the sealant 11.

It should be noted that the first thin-film layer in the first zone 201 that attaches the sealant 11 and the second thin-film layer in the second zone 202 that attaches the sealant 11 can have a different material.

Alternatively, the first thin-film layer in the first zone 201 that attaches the sealant 11 and the second thin-film layer in the second zone 202 that attaches the sealant 11 can have a same material. For example, a thin-film layer comprising an insulating composition can be formed on the substrate having the second signal line 302. As such, the thin-film layer can comprise $SiN_x$ or a resin, the latter having a better light transmission rate.

The following is a detailed description of a method of manufacturing an array substrate whose uneven structure 50 has a resin composition, i.e., which has a resin layer 40 in the surrounding area 20 corresponding to the sealant 11, as exemplified in FIG. 4 or FIG. 5.

A second zone 202 can be arranged in the surrounding area 20 and can be arranged to be next to the first zone 201. As such, after the step S102, the method can further include:

First, a resin layer 40 is formed over the substrate 01 having the second signal line 302 (as shown in FIG. 4).

Herein it can be configured such that a first portion of the resin layer 40 in the first zone 201 and a second portion of the resin layer 40 in the second zone 202 have a different thickness. Specifically, by exposing and developing processes, the first portion of the resin layer 40 in the first zone 201 and the second portion of the resin layer 40 in the second zone 202 can be configured to have a different thickness, i.e. to have a height difference ΔH.

Specifically, if the resin layer 40 comprises a positive resist and the thickness of the first portion of the resin layer 40 in the first zone 201 is smaller than the thickness of the second portion of the resin layer 40 in the second zone 202, a mask having a semi-transparent portion and a non-transparent portion can be used to expose the whole resin layer 40.

It is configured such that the semi-transparent portion of the mask corresponds to, and aligns with, the first zone 201, and the non-transparent portion of the mask corresponds to, and aligns with, the second zone 202. As such, the first portion of the resin layer 40 in the first zone 201 can be dissolved in a developer (i.e. developing solution) under the light, whereas the second portion of the resin layer 40 in the second zone 202 cannot be dissolved in the developer due to the absence of the light. Thereby the first portion of the resin layer 40 in the first zone 201 can have a relatively smaller thickness whereas the second portion of the resin layer 40 in the second zone 202 can have a relatively bigger thickness.

Alternatively, a mask having a transparent portion and a non-transparent portion can be used to expose the resin layer 40. It is configured such that the transparent portion of the mask corresponds to, and aligns with, the first zone 201, and the non-transparent portion of the mask corresponds to, and aligns with, the second zone 202.

As such, by controlling the amount of the incident light and the time of lighting, the first portion of the resin layer 40 in the first zone 201 can be dissolved in a developer (i.e. developing solution). The second portion of the resin layer 40 in the second zone 202 cannot be dissolved in the developer due to the absence of the light. Thereby the first portion of the resin layer 40 in the first zone 201 can have a relatively smaller thickness whereas the second portion of the resin layer 40 in the second zone 202 can have a relatively bigger thickness.

It is noted that the above description is exemplified by an embodiment where the resin layer 40 comprises a positive resist and the thickness of the first portion of the resin layer 40 in the first zone 201 is smaller than the thickness of the second portion of the resin layer 40 in the second zone 202.

The similar principle and processes can be applied in embodiments where the resin layer 40 comprises a negative resist or the thickness of the first portion of the resin layer 40 in the first zone 201 is bigger than the thickness of the second portion of the resin layer 40 in the second zone 202. The detailed description is skipped herein.

Finally, a sealant 11 is formed in the surrounding area 20, and it is configured such at a first part of the sealant 11 is in the first zone 201, and the rest region (i.e. a second part) of the sealant 11 is in the second zone 202.

As such, by arranging a resin layer 40 in the first zone 201, the height difference between the staggering region 30 that is between the first signal line 301 and the second signal line 302 and other regions in the first zone 201 can be reduced, thereby causing the substrate having the first signal line 301 and the second signal line 302 to have a close-to-be flat upper surface in the first zone 201.

On the other hand, by configuring a height difference ΔH between the first portion of the resin layer 40 in the first zone

201 and the second portion of the resin layer 40 in the second zone 202, the sealant 11 and the array substrate can have an uneven attaching surface (or interface), resulting in an increased attachment or affinity between the sealant 11 and the array substrate, and leading to a lowered chance for detachment of the sealant 11.

In embodiments where a second zone 202 is arranged in the surrounding area 20 and next to the first zone 201, after the step S102, the method can further include:

First, forming a resin layer 40 over the substrate 01 having the second signal line 302.

Second, forming an empty region 100 in the resin layer 40 in a region corresponding to the first zone 201 by removing the resin material in the first zone 201.

Third, forming a sealant 11 in the surrounding area 20, wherein a first part of the sealant 11 is in the first zone 201, and a second part of the sealant 11 is in the second zone 202 next to the first zone 201.

As such, by removing the resin material in a region corresponding to the first zone 201 to thereby form the empty region 100, it can be avoided to form a resin island 02 in a region corresponding to the staggering region 30 between the first signal line 301 and the second signal line 302, and instead, the substrate having the first signal line 301 and the second signal line 302 can thus have a close-to-be flat upper surface in the first zone 201.

On the other hand, by configuring the empty region 100 and configuring a height difference ΔH between the first zone 201 and the second zone 202 (as illustrated in FIG. 5), the sealant 11 and the array substrate can have an uneven attaching surface (or interface), resulting in an increased attachment or affinity between the sealant 11 and the array substrate, and leading to a lowered chance for detachment of the sealant 11.

Furthermore, if the array substrate contains TFTs (for example, a pixel subunit in the display area 10 comprises TFTs, or the shift register (RS) in the surrounding area 20 comprises TFTs), the first signal line 301, the second signal line 302, the insulating layer 303, and the separation layer 304 as described above, can be fabricated during the manufacturing of the TFTs, so as to simplify the fabrication process of the array substrate.

Specifically, the following steps can be carried out.

First, a gate electrode metal layer can be formed over the substrate 01 (as shown in FIG. 7 or FIG. 8), and then by one-time patterning, a gate electrode 311 of a TFT as shown in FIG. 8, as well as a pattern of gate lines, can be formed in the display area 10 and the surrounding area 20, and a pattern for first signal lines, as illustrated in FIG. 7, can be formed in the surrounding area 20. As such, the first signal line 301 and the gate electrode 311 comprise a same composition.

Second, an insulating material layer can be formed over the substrate 01, and then by one-time patterning, a gate insulating layer 313 at a region corresponding to the staggering region 30 between the first signal line 301 and the second signal line 302, as well as the insulating layer 303 in the surrounding area 20 (as illustrated in FIG. 7), can be further formed. As such, the insulating layer 303 and the gate insulating layer 313 comprise a same composition.

Specifically, an insulating material layer can be formed over the substrate 301 having the gate electrode 311, the gate lines, and the first signal line 301. Then by one-time patterning, a pattern for a gate insulating layer 313 can be formed over a surface of the gate electrode 311, and a pattern for insulating layer 303 can also be formed over a surface of the first signal line 301 in the staggering region 30.

Third, a source-drain metal layer can be formed over the substrate 01. Specifically, a source-drain metal layer can be formed over a surface of the substrate having the pattern for gate insulating layer 313 and the insulating layer 303. Then by one-time patterning, a pattern for a source electrode 3121, a drain electrode 3122, and data lines that cross the gate lines, can be formed in the display area 10 and the surrounding area 20, as shown in FIG. 8, and a pattern for the second signal line 302 as shown in FIG. 7 can be formed in the surrounding area 20. As such, the second signal line 302 and the source electrode 3121 and the drain electrode 3122 comprise a same composition.

Herein the first signal line 301 and the second signal line 302 are configured to have a staggering region 30, and are configured to be insulated by arranging the above mentioned insulating layer 303 in the staggering region 30 between the first signal line 301 and the second signal line 302.

Fourth, a resin layer 40 can be formed over the substrate 01, or specifically, a resin layer 40 can be formed over a surface of the substrate having the source electrode 3121, the drain electrode 3122, data lines, and the second signal line 302. The resin layer 40 is configured to cover the display area 10 and the surrounding area 20. Then an empty region 100 (as illustrated in FIG. 6 or FIG. 9) can be formed in the resin layer 40 by patterning, and it is configured that the staggering region 30 between the first signal line 301 and the second signal line 302 is localized in the empty region 100.

On the above basis, if the display apparatus employing the array substrate is of an AD-SDS (advanced-super dimensional switching) type, after forming the resin layer 40, the method for manufacturing the array substrate according to some embodiments of the present disclosure can further include the following steps:

First, a first indium tin oxides (ITO) thin-film layer is formed over a surface of the substrate 40 having the resin layer 40 as described above, and then by patterning, a plurality of common electrodes 316 are formed in the display area 10 (as illustrated in FIG. 8), wherein the plurality of common electrodes 316 are each patch-like and aligned in a matrix.

Second, a protection layer 305 is formed over a surface of the substrate having the empty region 100 of the resin layer 40 and the plurality of common electrode 316, wherein the protection layer 305 has a composition of $SiN_x$.

Third, a via is formed through the protection layer 305 at a position corresponding to the drain electrode 3122; then after forming a second indium tin oxides (ITO) thin-film layer over the protection layer 305, a plurality of pixel electrodes 317 are formed by patterning to thereby finish the fabrication of the array substrate. Herein the plurality of pixel electrodes 317 are configured to have a shape of slits and to electrically connect the drain electrode 3122 through the via.

It should be noted that the above description of the method for manufacturing an array substrate uses an example of an array substrate whose common electrodes 316 are closer to the substrate 01 than pixel electrodes 317, i.e. whose pixel electrodes 317 are above the common electrodes 316. In embodiments of the array substrate which is employed in a display apparatus of the ADS type, the pixel electrodes 317 can be below the common electrodes 316, i.e. the pixel electrodes 317 are closer to the substrate 01 than the common electrodes 316. There are no limitations herein.

Although an insulating layer 303 has been arranged between the first signal line 301 and the second signal line 302 to provide insulation between the first signal line 301 and the second signal line 302, in order to further increase the level of protection to prevent an electrostatic breakdown from happening between the first signal line 301 and the second signal line 302, a separation layer 304 can be further disposed between the insulation layer 303 and the second signal line 302, as illustrated in FIG. 7.

As such, after forming the insulating layer 303 and prior to forming the second signal line 302, the method can comprise:

Forming a semiconductor material layer over the substrate 01, i.e. over a surface of the substrate having the gate insulating layer 313 and the insulating layer 303; and Forming, by patterning, a pattern of a semiconductor active layer 314 in the display area 10 and the surrounding area 20 (as shown in FIG. 8) and a pattern of a separation layer 304 in the staggering region 30 between the first signal line 301 and the second signal line 302. As such, the semiconductor active layer 314 and the separation layer 304 comprise a same material.

The separation layer 304 as described above can increase the level of protection to prevent an electrostatic breakdown from happening between the first signal line 301 and the second signal line 302. In addition, because the separation layer 304 and the semiconductor active layer 314 in TFTs can be fabricated by one-time patterning, the manufacturing method can thus be simplified.

All references cited in the present disclosure are incorporated by reference in their entirety. Although specific embodiments have been described above in detail, the description is merely for purposes of illustration. It should be appreciated, therefore, that many aspects described above are not intended as required or essential elements unless explicitly stated otherwise.

Various modifications of, and equivalent acts corresponding to, the disclosed aspects of the exemplary embodiments, in addition to those described above, can be made by a person of ordinary skill in the art, having the benefit of the present disclosure, without departing from the spirit and scope of the disclosure defined in the following claims, the scope of which is to be accorded the broadest interpretation so as to encompass such modifications and equivalent structures.

The invention claimed is:

1. An array substrate, comprising:
a display area; and
a surrounding area having a first signal line, and a second signal line disposed over, insulated from, and staggered at a staggering region with, the first signal line, the surrounding area encircling the display area;
wherein:
the surrounding area comprises a first zone and a second zone, wherein the first zone and the second zone are configured to have a height difference to form a substantially uneven upper surface of the array substrate to thereby allow a sealant to be securely attached onto the array substrate; and
an upper surface of the first zone is substantially flat across the first zone from over a side of the second signal line to an opposing side of the second signal line.

2. The array substrate of claim 1, further comprising:
a substrate; wherein:
the first signal line is disposed over the substrate; and
the second signal line has a substantially flat upper surface across the second signal line;
wherein:
the staggering region is in the first zone; and
an orthographic projection of the first signal line on the substrate crosses an orthographic projection of the second signal line on the substrate at a region coinciding with an orthographic projection of the staggering region on the substrate.

3. The array substrate of claim 2, further comprising an insulating layer, disposed between the first signal line and the second signal line at the staggering region.

4. The array substrate of claim 2, further comprising a separation layer, disposed between the insulating layer and the second signal line at the staggering region.

5. The array substrate of claim 3, further comprising at least one thin-film transistor (TFT), each having a gate electrode, a gate insulating layer, a semiconductor active layer, a source electrode, and a drain electrode, successively disposed over the substrate, wherein:
the first signal line and the gate electrode are configured to be at a substantially same layer and have a substantially same composition;
the insulating layer and the gate insulating layer are configured to be at a substantially same layer and have a substantially same composition;
the separation layer and the semiconductor active layer are configured to be at a substantially same layer and have a substantially same composition; and
the second signal line and the source electrode and the drain electrode are configured to be at a substantially same layer and have a substantially same composition.

6. The array substrate of claim 1, further comprising at least one insulating material layer, disposed over an upper surface of the first zone and the second zone of the surrounding area, wherein the at least one insulating material layer has a thickness in the first zone lower than in the second zone.

7. The array substrate of claim 1, further comprising at least one insulating material layer, disposed over an upper surface of the second zone of the surrounding area.

8. The array substrate of claim 2, further comprising at least one insulating material layer, disposed over an upper surface of the staggering region in the first zone and the second zone, wherein the at least one insulating material layer has a thickness in the staggering region lower than in the second zone.

9. The array substrate of claim 6, wherein the at least one insulating material layer comprises a resin layer.

10. The array substrate of claim 9, wherein the resin layer has a dielectric constant of substantially 1 to 4.

11. The array substrate of claim 9, wherein the at least one insulating material layer further comprises a protection layer, wherein the protection layer is disposed over the resin layer.

12. The array substrate of claim 11, wherein the protection layer comprises $SiN_x$.

13. The array substrate of claim 2, wherein a height of the first zone is measured from the upper surface of the first zone in contact with the sealant to a bottom surface of the substrate distal from the first signal line; and a height of the second zone is measured from an upper most surface of the second zone in contact with the sealant to the bottom surface of the substrate distal from the first signal line.

14. The array substrate of claim 1, wherein an upper surface of the second zone of the surrounding area is uneven.

15. A display panel, comprising the array substrate according to claim 1.

16. The display panel according to claim 15, further comprising:
   an opposite substrate; and
   a sealant;
   wherein:
      the sealant is disposed between the array substrate and the opposite substrate; and
      the sealant is configured to securely attach the array substrate in the first zone and the second zone in the surrounding area of the array substrate.

17. A display apparatus, comprising the display panel according to claim 15.

18. The array substrate of claim 2, wherein the upper surface of the first zone is substantially flat throughout over the staggering region and over the first and second signal lines.

19. The array substrate of claim 1, wherein the first zone is closer to the display area than the second zone.

\* \* \* \* \*